(12) United States Patent
Yoshida et al.

(10) Patent No.: US 8,686,980 B2
(45) Date of Patent: Apr. 1, 2014

(54) ARRAY SUBSTRATE AND LIQUID CRYSTAL DISPLAY PANEL

(75) Inventors: Masahiro Yoshida, Osaka (JP); Isao Ogasawara, Osaka (JP); Satoshi Horiuchi, Osaka (JP); Takaharu Yamada, Osaka (JP); Shinya Tanaka, Osaka (JP); Tetsuo Kikuchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 112 days.

(21) Appl. No.: 13/521,308

(22) PCT Filed: Dec. 1, 2010

(86) PCT No.: PCT/JP2010/071503
§ 371 (c)(1),
(2), (4) Date: Jul. 10, 2012

(87) PCT Pub. No.: WO2011/086782
PCT Pub. Date: Jul. 21, 2011

(65) Prior Publication Data
US 2012/0293471 A1  Nov. 22, 2012

(30) Foreign Application Priority Data
Jan. 13, 2010  (JP) ................................. 2010-005256

(51) Int. Cl.
*G06F 3/038* (2013.01)
*G09G 5/00* (2006.01)
(52) U.S. Cl.
USPC ............................................ 345/205; 345/87

(58) Field of Classification Search
USPC ........................ 345/204, 205, 87, 90, 98, 100
See application file for complete search history.

(56) References Cited

U.S. PATENT DOCUMENTS

| 2003/0222311 | A1 | 12/2003 | Kim |
| 2006/0022201 | A1 | 2/2006 | Kim et al. |
| 2008/0018572 | A1 | 1/2008 | Shin et al. |
| 2010/0283931 | A1 | 11/2010 | Horiuchi et al. |
| 2011/0291097 | A1 | 12/2011 | Ogasawara et al. |

FOREIGN PATENT DOCUMENTS

| JP | 2005-527856 A | 9/2005 |
| JP | 2006-039524 A | 2/2006 |
| JP | 2008-026865 A | 2/2008 |
| WO | 2009/128179 A1 | 10/2009 |

OTHER PUBLICATIONS

Official Communication issued in International Patent Application No. PCT/JP2010/071503, mailed on Feb. 8, 2011.

*Primary Examiner* — Ricardo L Osorio
(74) *Attorney, Agent, or Firm* — Keating & Bennett, LLP

(57) ABSTRACT

A gate driving circuit (60) separated into a plurality of stages (ST) is provided. In each of the stages (ST), TFT elements (T1) through (T4) are provided, branch lines (78) that connect clock lines (72, 74) to the TFT elements are provided. Junction lines (79A, 79B) are each extended from the branch line (78A) of interest to electrically connect the branch line (78A) of interest to the TFT elements (T2, T4) provided in the stage (ST(j)) different from the stage (ST (j−1)) where the TFT elements (T1, T3) connected to the branch line (78A) of interest are provided.

12 Claims, 12 Drawing Sheets ered to as "TFTs") as switching# ARRAY SUBSTRATE AND LIQUID CRYSTAL DISPLAY PANEL

TECHNICAL FIELD

The present invention relates to an (i) array substrate in which TFT elements and other components are provided on an insulating substrate and (ii) a liquid crystal display panel prepared with the array substrate.

BACKGROUND ART

Active matrix-type display devices provided with thin film transistors (hereinafter referred to as "TFTs") as switching elements for pixels, which have fast response speeds and readily provide display with multilevel grayscale, have been used in a wide variety of devices including a television set, a mobile phone, a portable game machine, and a vehicle-mounted navigation system.

In a typical active matrix-type display device, a TFT array substrate and a counter substrate are opposed to each other, and a display element (liquid crystal, organic electroluminescence, etc.) is sealed with a sealing material between the TFT array substrate and the counter substrate.

(TFT Array Substrate)

The following will describe the configuration of a TFT array substrate with reference to FIG. 12.

FIG. 12 is a plan view schematically showing the configuration of an essential part of the TFT array substrate.

As shown in FIG. 12, a TFT array substrate 20 has a display area 22 formed in a central part thereof, and display-driving-use TFT elements (switching elements) (not shown) for driving pixel electrodes are formed in a matrix manner in the display area 22.

As to the display-driving-use TFT element, a gate electrode is connected to a gate line 42, a source electrode is connected to a source line 44, and a drain electrode is connected to a pixel electrode (not shown).

The gate lines 42 and the source lines 44 are provided in directions orthogonal to each other on the TFT array substrate 20. Note that the gate lines 42 and the source lines 44 are provided in different layers disposed on the TFT array substrate 20 through an insulating layer interposed therebetween, so that the gate lines 42 and the source lines are not electrically connected to each other at intersection thereof.

In an area surrounding the display area 22, i.e. in an area near a substrate end side 26 of the TFT array substrate 20, a surrounding area 24 is formed. On right and left ends of the surrounding area 24 (in a direction indicated by an arrow X in FIG. 12), a gate driving circuit 60 is provided.

The gate driving circuit 60 is electrically connected to the gate lines 42 and applies gate signals to the gate lines 42.

The gate driving circuit 60 is provided on the right and left ends of the surrounding area 24. Therefore, in cases where each of the gate lines 42 receives signals from its both ends, it is possible to reduce waveform distortion of the signals. This makes it possible to downsize a plurality of TFT elements (driving elements) making up the gate driving circuit 60, thus providing a liquid crystal display panel 10 having a narrow picture frame.

Further, even in cases where each of the gate lines 42 receives signals only from one end, sizes of right and left picture frame regions of the liquid crystal display panel 10 can be made equal by separating the gate lines 42 into (a) a group of the gate lines 42 that are driven by the right-side gate driving circuit 60 and (b) a group of the gate lines 42 that are driven by the left-side gate driving circuit.

Meanwhile, on one end of upper and lower ends of the surrounding area 24 (in a direction indicated by an arrow Y in FIG. 12), a driver 62 is provided.

The driver 62 is electrically connected to the source lines 44 and applies source signals to the source lines 44.

Further, both of the gate driving circuits 60 are electrically connected respectively to gate driving circuit lines which comprise a clock line and other lines. To the gate driving circuit lines, signals necessary for operation of the gate driving circuit 60 are supplied from a DC/DC converter and a display control circuit, which are located outside the TFT array substrate 20, through FPCs (Flexible Printed Circuits) or the like.

Note that the gate driving circuit lines (not shown) of the right-side gate driving circuit 60 and the gate driving circuit lines 46 of the left-side gate driving circuit 60 are interconnected through lines 64, for example, on a side of the display area 22 opposite to the side thereof on which the driver 62 is provided.

The interconnection between both of the gate driving circuit lines eliminates the need for supply of signals to both the gate driving circuit lines (not shown) of the right-side gate driving circuit 60 and the gate driving circuit lines 46 of the left-side gate driving circuit 60 through the FPC. Therefore, it is possible to form the FPC with a narrow width and to thus reduce cost of the FPCs. Note that as shown in FIG. 12, it is preferable that the lines 64 are configured not to interconnect with the source lines 44 in terms of the effect of reducing a signal load.

In FIG. 12, the gate driving circuits 60 are provided on both sides of the display area 22. Alternatively, the gate driving circuit 60 may be provided on one side of the display area 22. Further, the signals supplied to the gate driving circuit lines 46 may be fed from the driver 62.

The TFT array substrate 20 and the counter substrate (not shown) are bonded together through a seal 90, which makes up the liquid crystal display panel 10. The seal 90 is provided in picture frame shape in an inner area of the TFT array substrate 20 along the substrate end side 26 of the TFT array substrate 20.

(Patent Literature 1)

A specific configuration of the gate driving circuit 60 is, for example, the configuration described in Patent Literature 1.

FIG. 13 is a block diagram schematically showing the configuration of gate driving circuit 60 described in Patent Literature 1.

As shown in FIG. 13, in the surrounding area 24, the gate driving circuit lines 46 connected to the gate driving circuit 60 and the FPC (not shown) are provided.

The gate driving circuit lines 46 provided along the Y direction of the TFT array substrate 20 are: a low-potential power supply line 70 as a trunk line, a first clock line 72 as trunk line, a second clock line 74 as a trunk line, and an initialization line 76 as a trunk line.

Note that these four lines, i.e. the low-potential power supply line 70, the first clock line 72, the second clock line 74, and the initialization line 76 are all provided between the gate driving circuit 60 and the substrate end side 26, i.e. outside the gate driving circuits 60.

The gate driving circuit 60 includes a plurality of stages ST that are connected to each other in a cascaded manner and sequentially output gate signals to the gate lines 42. Note that the stages ST are connected to the gate lines (not shown) on a one-to-one basis. Specifically, the stages ST are connected to each other in a cascaded manner. For example, a set terminal (not shown) in a j-th stage ST (j) receives a carry output from the preceding stage ST (j−1), and a reset terminal (not shown) receives a gate output from the subsequent stage ST (j+1).

The gate driving circuit lines 46 and the gate driving circuit 60 are electrically connected to each other through branch lines 78 extending in a lateral direction (X direction).

The following will describe more details of the gate driving circuit 60.

Each of the stages ST making up the gate driving circuit 60 includes TFT elements T1 through T13 and T15.

For example, in the stage ST (j−1) in the (j−1)th row, the TFT element T4 is placed on the upper side so as to be close to the preceding stage ST (j−2) and receives the carry signal from the preceding stage ST (j−2).

The TFT elements T1, T7, T10, T12, and T15 are placed along the branch line 78 as a connection line to the first clock line 72 and receive clock signals from the first clock line 72.

The TFT elements T11 and T5 are placed along the branch line 78 as a connection line to the second clock line 74 and receive clock signals from the second clock line 74.

The TFT element T6 is placed along the branch line 78 as a connection line to the initialization line 76 and receives an initialization signal from the initialization line 76.

The TFT elements T2, T3, T8, T9, and T13 are placed along the branch line 78 as a connection line to the low-potential power supply line 70 and receive low-potential signals for turning off gates of the TFT elements from the low-potential power supply line 70.

CITATION LIST

Patent Literature 1
Japanese Patent Application Publication, Tokukai, No. 2006-039524 A (Publication Date: Feb. 9, 2006)
Patent Literature 2
Japanese Unexamined Patent Application Publication (Translation of PCT Application) No. 2005-527856 A (Publication Date: Sep. 15, 2005)
Patent Literature 3
Japanese Patent Application Publication, Tokukai, No. 2008-026865 A (Publication Date: Feb. 7, 2008)

SUMMARY OF INVENTION

Technical Problem

However, the configuration of the gate driving circuit 60 described in Patent Literature 1 has the problem that defects such as breaks in the lines are likely to occur. This is because the gate driving circuit lines 46 that apply signals to the stages ST are placed between the gate driving circuit 60 and the substrate end side 26, i.e. outside the gate driving circuit 60, and this lengthens the branch lines 78 that connect the gate driving circuit lines 46 to the TFT elements inside the gate driving circuit 60.

The present invention has been attained in view of the above problem, and an object of the present invention is to provide an array substrate having a narrow picture frame while curbing the occurrence of breaks in branch lines.

Solution to Problem

In order to solve the above problem, an array substrate of the present invention includes: an insulating substrate having a display area and its surrounding area; switching elements arranged in a matrix manner on the insulating substrate; pixel electrodes arranged in a matrix manner in the display area of the insulating substrate and being connected to the switching elements; and driving circuits for driving the switching elements, the driving circuits being provided in the surrounding area and comprising a plurality of column groups arranged in a direction from an end side of the insulating substrate toward the display area, wherein each of the column groups has a longitudinal side along the end side of the insulating substrate and comprise a plurality of row groups corresponding to rows of the pixel electrodes arranged in a matrix manner and each having a plurality of driving elements; a plurality of trunk lines extending along the end side of the insulating substrate in the surrounding area, at least one of the trunk lines being provided between the adjacent column groups; branch lines being provided in the surrounding area and each connecting the trunk line to the driving element; and junction lines each extending from the branch line of interest to electrically connect the branch line of interest to the driving element provided in the row group different from the row group where the driving element connected to the branch line of interest is provided.

The above-described configuration reduces the lengths of the trunk lines provided between the adjacent column groups and the length of the branch line that connect the trunk line to the driving elements. This makes it possible to reduce the occurrence of breaks in the lines.

Further, extension of the junction lines from the branch line reduces the number of branch lines that connect the trunk line to the driving element. This makes it possible to prevent yield reduction.

Still further, the reduction of the number of intersections between the trunk lines and branch lines decreases capacitance that occurs at the intersections, thus preventing the occurrence of signal delay. In addition, the above-described configuration enables the use of the elements having a small direct-current amplification factor. This makes it possible to downsize the driving elements that make up each of the row groups. Besides, the above-described configuration facilitates downsizing the driving circuit. This makes it possible to provide an array substrate having a narrow picture frame.

Advantageous Effects of Invention

In order to solve the above problem, an array substrate of the present invention includes: an insulating substrate having a display area and its surrounding area; switching elements arranged in a matrix manner on the insulating substrate; pixel electrodes arranged in a matrix manner in the display area of the insulating substrate and being connected to the switching elements; and driving circuits for driving the switching elements, the driving circuits being provided in the surrounding area and comprising a plurality of column groups arranged in a direction from an end side of the insulating substrate toward the display area, wherein each of the column groups has a longitudinal side along the end side of the insulating substrate and comprise a plurality of row groups corresponding to rows of the pixel electrodes arranged in a matrix manner and each having a plurality of driving elements; a plurality of trunk lines extending along the end side of the insulating substrate in the surrounding area, at least one of the trunk lines being provided between the adjacent column groups; branch lines being provided in the surrounding area and each connecting the trunk line to the driving element; and junction lines each extending from the branch line of interest to electrically connect the branch line of interest to the driving element provided in the row group different from the row group where the driving element connected to the branch line of interest is provided.

This achieves the effect of providing an array substrate having a narrow picture frame while curbing the occurrence of breaks in the branch lines.

DESCRIPTION OF EMBODIMENTS

The following will describe details of an embodiment of the present invention.

First Embodiment

The following will describe one embodiment of the present invention with reference to FIGS. 1 through 5.

Figure 12:
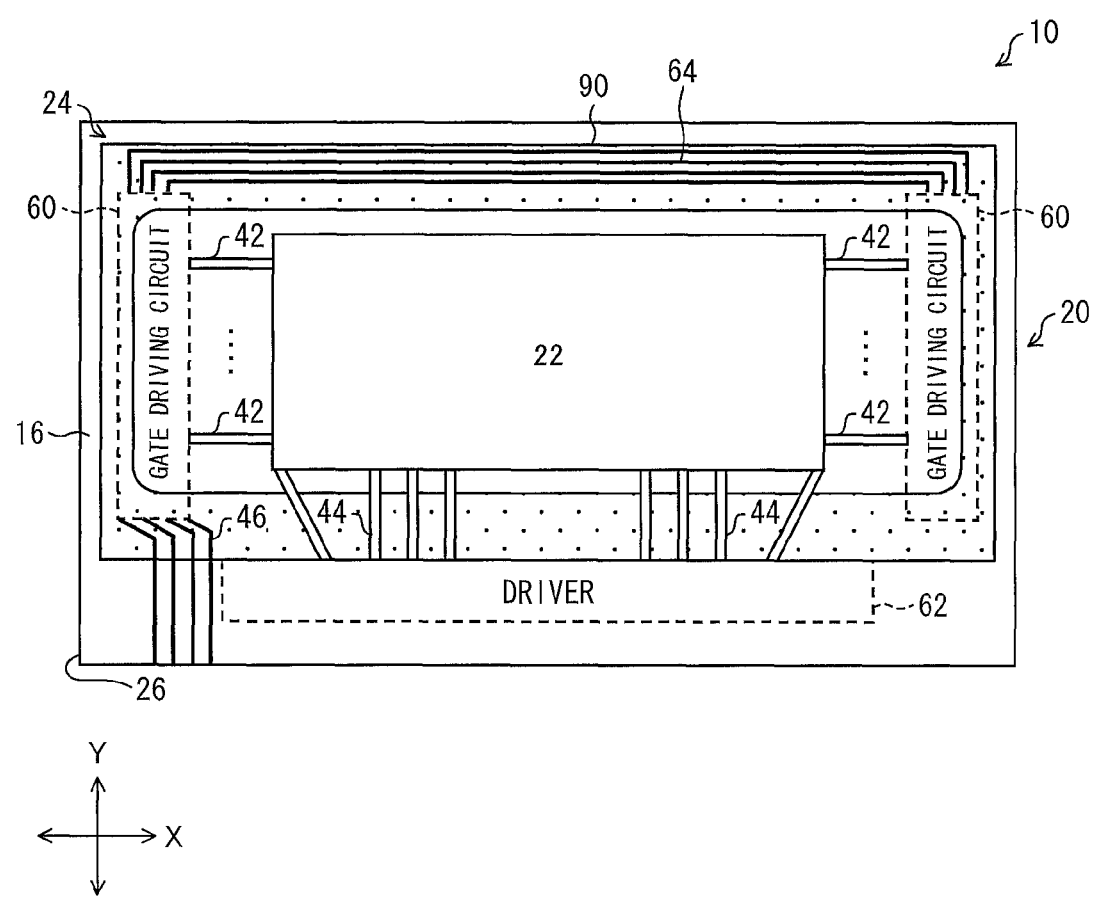
FIG. 12 is a plan view schematically showing the configuration of an essential part of a TFT array substrate.
Figure 13:
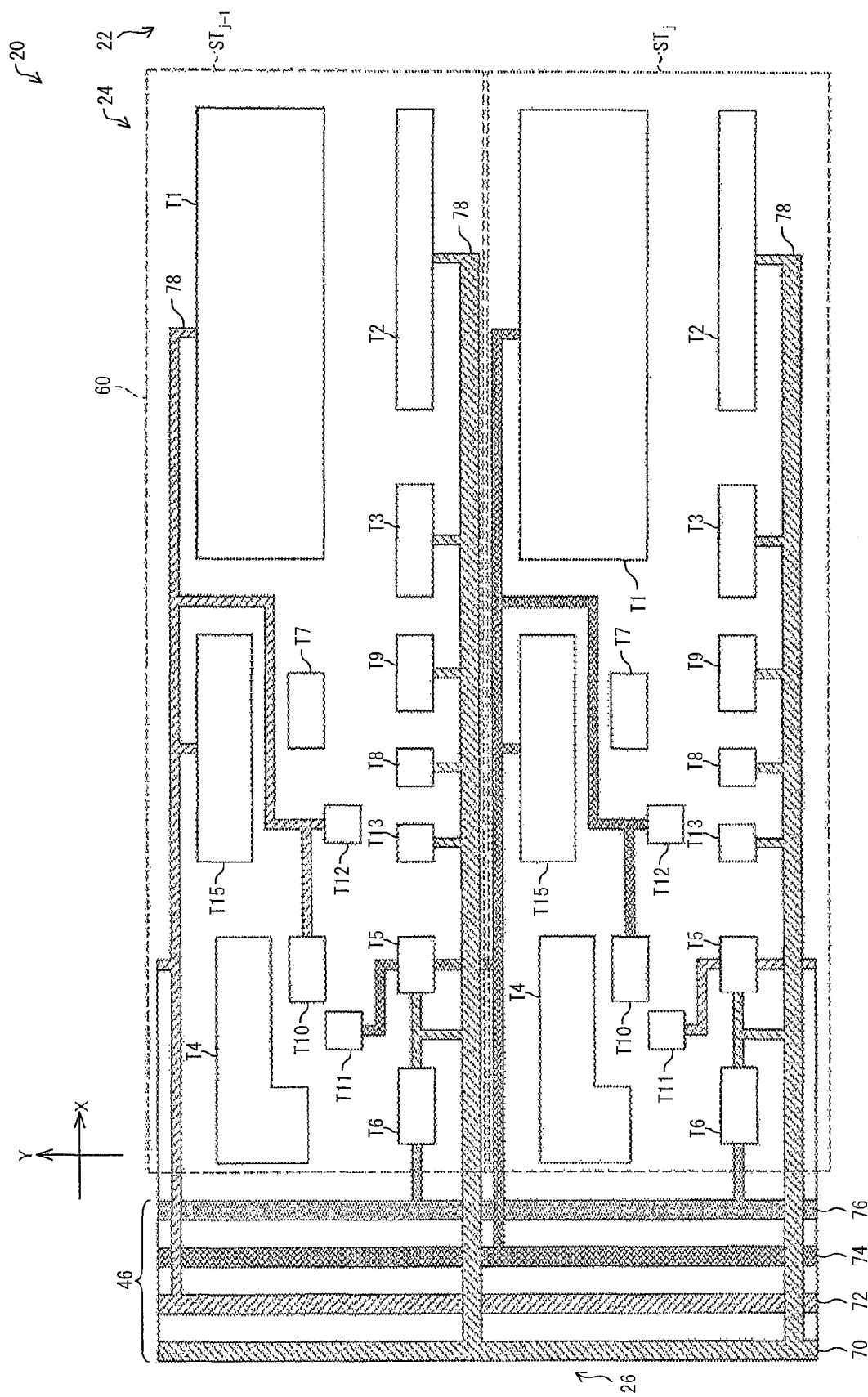
FIG. 13 is a plan view schematically showing the configuration of an essential part of a TFT array substrate described in Patent Literature 1.

A TFT array substrate 20 of the present embodiment is configured in much the same manner as the TFT array substrate 20 described previously with reference to FIG. 12.

Figure 1:
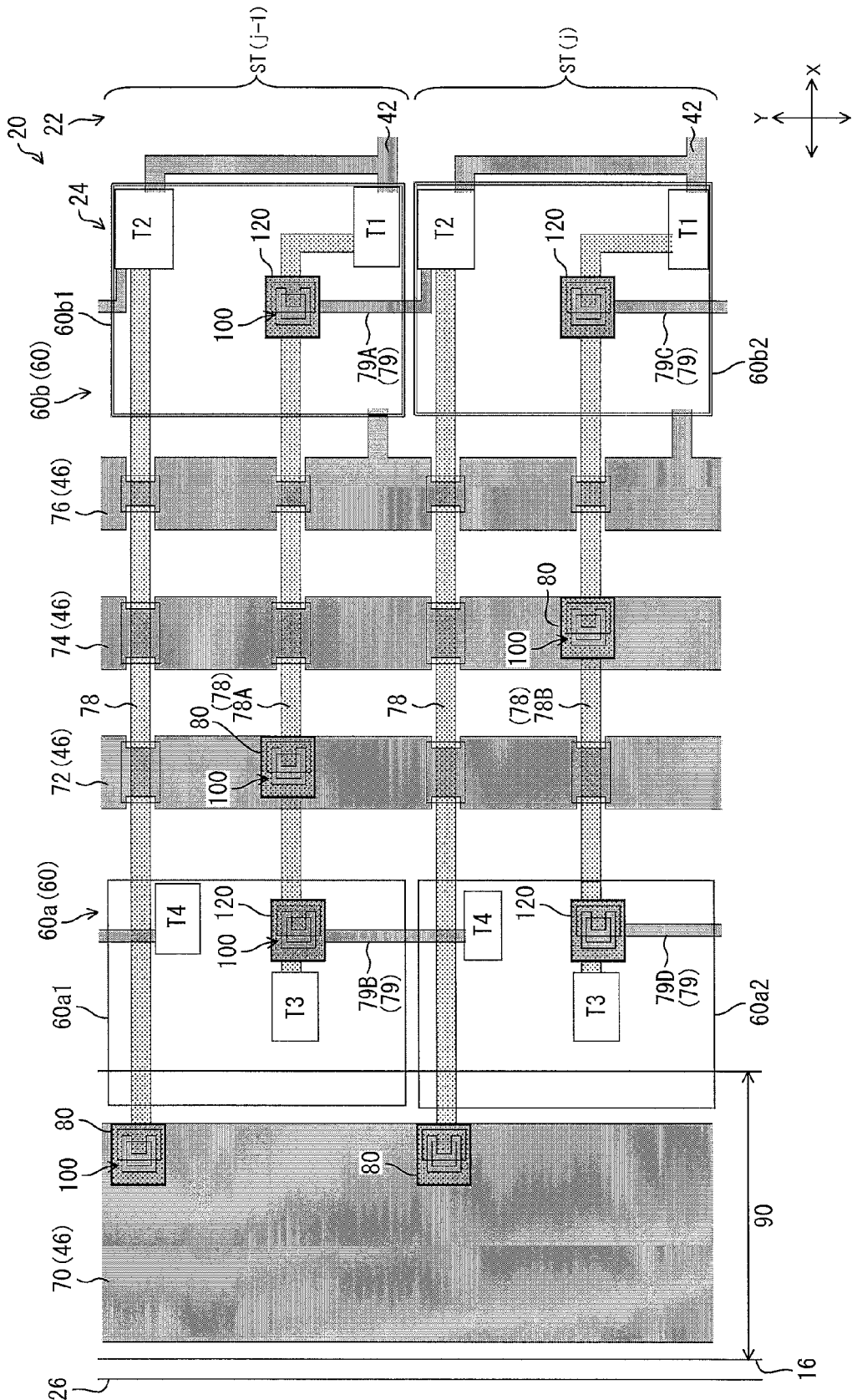
FIG. 1 is a plan view schematically showing the configuration of an essential part of a TFT array substrate according to First Embodiment of the present invention.

FIG. 1 is a plan view schematically showing the configuration of an essential part of the TFT array substrate 20 of the present embodiment.

As shown in FIG. 1, the TFT array substrate 20 as an array substrate has, in its surrounding area 24, a gate driving circuit 60 (60a, 60b) and gate driving circuit lines 46 which are connected to a FPC (not shown). In the gate driving circuit 60 as driving circuits, TFT elements as driving elements are formed.

In the TFT array substrate 20 of the present embodiment, the gate driving circuit 60 has two separate driving circuits along an X direction of the TFT array substrate 20. Specifically, a first column driving circuits 60a and a second column driving circuit 60b are provided as column groups in the X direction and make up the gate driving circuit 60.

Further, the first column driving circuit 60a and the second column driving circuit 60b have each a plurality of driving circuits (row groups), corresponding to respective rows, provided in a Y direction of the TFT array substrate 20. This will be described in detail later.

In the TFT array substrate 20 of the present embodiment, at least some of the gate driving circuit lines 46 are provided between the first column driving circuit 60a and the second column driving circuit 60b.

Specifically, the gate driving circuit lines 46 provided along the Y direction of the TFT array substrate 20 are: a low-potential power supply line 70 as a trunk line, a first clock line 72 as a trunk line, a second clock line 74 as a trunk line, and an initialization line 76 as a trunk line. Along a direction from a substrate end side 26 toward a display area 22, one low-potential power supply line 70, the first clock line 72, the second clock line 74, and the initialization line 76 are provided in this order.

Here, the display area 22 is an area where display-driving-use TFT elements (not shown), as switching elements, and pixel electrodes (not shown) connected to the display-driving-use TFT elements are arranged in a matrix manner.

Of all the gate driving circuit lines 46, the first clock line 72, the second clock line 74, and the initialization line 76 are provided between the first column driving circuit 60a and the second column driving circuit 60b.

Note that the low-potential power supply line 70 is provided between the substrate end side 26 and the first column driving circuit 60a.

The following will more specifically describe the surrounding area 24 of the TFT array substrate 20 of the present embodiment.

The first column driving circuit 60a and the second column driving circuit 60b, which make up the gate driving circuit 60, have each a plurality of driving circuits, corresponding to the respective rows, provided along the Y direction.

Specifically, the first column driving circuit 60a and the second column driving circuit 60b are each made up of a plurality of driving circuits connected to each other in a cascaded manner in the Y direction.

In other words, the gate driving circuit 60 has a plurality of stages ST that sequentially output gate signals to the gate lines 42. Note that the stages ST are connected to the gate lines 42 on a one-to-one basis.

Each of the stages ST includes the first column driving circuit 60a and the second column driving circuit 60b both of which are aligned in the X direction.

For example, in a stage ST (j−1) in a (j−1)th row, a first column driving circuit 60a1 and a second column driving circuit 60b1 are aligned in the X direction.

Further, in a stage ST (j) in a (j)th row, a first column driving circuit 60a2 and a second column driving circuit 60b2 are aligned in the X direction.

Each of the first column driving circuits 60a is provided between the low-potential power supply line 70 and the first clock line 72, both of which are trunk lines. Each of the second column driving circuits 60b lies in a boundary region between the display area 22 and the surrounding area 24 and are provided between the display area 22 and the initialization line 76.

Note that each of the first column driving circuits 60a includes TFT elements T3 and T4, and each of the second column driving circuits 60b includes TFT elements T1 and T2.

Further, branch lines 78 are provided to connect the gate driving circuit lines 46 to the TFT elements provided in the gate driving circuit 60. Contact holes 100 are provided at corresponding connection sections 80 between the branch line 78 and the low-potential power supply line 70, between the branch line 78 and the first clock line 72, and between the branch line 78 and the second clock line 74. Through the contact holes 100, the gate driving circuit lines 46 and the gate driving circuit 60 are electrically connected to each other.

For example, in the stage ST (j−1), the TFT elements T1 and T3 are connected to a branch line 78A which is electrically connected to the first clock line 72 through the contact hole 100, so that the TFT elements T1 and T3 receive a clock signal from the first clock line 72.

Meanwhile, in the stage ST (j), the TFT element T2 is connected to a junction line 79A extending from the branch line 78A, so that the TFT element T2 receives the clock signal from the first clock line 72. The contact hole 100 is provided at a switch section 120 between the branch line 78A and the junction line 79A. The branch line 78A and the junction line 79A are electrically connected to each other.

Note that in each of the stages ST, two or more junction line 79 may be provided.

For example, in the stage ST (j), the TFT element T4 is connected to a junction line 79B extending from the branch line 78A, so that the TFT element T4 receives the clock signal from the first clock line 72. The contact hole 100 is provided at a switch section 120 between the branch line 78A and the junction line 79B. The branch line 78A and the junction line 79B are electrically connected to each other.

Further, in the stage ST (j), the TFT elements T1 and T3 are connected to a branch line 78B which is electrically connected to the second clock line 74 through the contact hole 100, so that the TFT elements T1 and T3 receive a clock signal from the second clock line 74. Note that junction lines 79C and 79D extending from the branch line 78B are connected to TFT elements provided in a subsequent stage ST (j+1) (not shown). Provided at switch sections 120 between the branch line 78B and the junction lines 79C and 79D are the contact holes 100. The branch line 78B is electrically connected to the junction line 79C and 79D.

As described above, for example, in the stage ST (j), the TFT elements T2 and T4 are electrically connected to the first clock line 72, so that a first clock signal is supplied from the first clock line 72 to the TFT elements T2 and T4. Meanwhile, the TFT elements T1 and T3 are electrically connected to the second clock line 74, so that a second clock signal is supplied from the second clock line 74 to the TFT elements T1 and T3. From the first clock line 72 and the second clock line 74, signals of mutually reversed phases are outputted.

The TFT elements T1 and T2 provided in each of the stages ST are electrically connected to the gate line 42, and the TFT element T2 provided in each of the stages ST is connected to the branch line 78 which is electrically connected to the low-potential power supply line 70 through the contact hole 100, so that the TFT element T2 receives a low-potential signal from the low-potential power supply line 70. The low-potential signal is a signal for turning the TFT element OFF, and the low-potential signal is supplied to a gate electrode of the TFT element.

In the present embodiment, provided between the first column driving circuit 60a and the second column driving circuit 60b are the first clock line 72, the second clock line 74, and the initialization line 76, all of which are the trunk lines. That is, these lines are surrounded by the gate driving circuit 60.

With the above configuration, the branch lines 78 for connecting the gate driving circuit lines 46 extending in the Y direction to the gate driving circuit 60 are mainly arranged between the first column driving circuit 60a and the second column driving circuit 60b. This reduces the lengths of the branch lines 78, thus reducing the occurrence of breaks in the lines.

The configuration in the present embodiment is such that the first clock line 72, the second clock line 74, and the initialization line 76, all of which are the trunk lines, are provided between the first column driving circuit 60a and the second column driving circuit 60b. However, the present invention is not limited to this configuration. Alternatively, at least one of the gate driving circuit lines 46 extending in the Y direction can be arranged as appropriate between the first column driving circuit 60a and the second column driving circuit 60b both of which are aligned in the X direction.

The low-potential power supply line 70 is a direct-current power supply line for supplying a gate-off potential of the TFT element. The gate-off potential is related to a leak current of the TFT element during a period in which a voltage applied to liquid crystal is retained in each pixel, and also related to display quality, such as decrease in contrast and display unevenness. Therefore, the low-potential power supply line 70 generally requires supply of a stable potential. For realization of low resistance, the low-potential power supply line 70 can be formed in such a manner that its line width is wider than those of the other trunk lines.

If the low-potential power supply line 70 is arranged inside the gate driving circuit 60 (on a side closer to the display area 22), part of the gate driving circuit 60 may get too close to the substrate end side 26 of a liquid crystal display panel 10 (see FIG. 12) or may lie off an edge of a seal 90. This can result in static-electricity-induced breakdown in the element, property abnormalities, corrosion, and other defects. Therefore, it is preferable that the low-potential power supply line 70 is arranged between the substrate end side 26 and the gate driving circuit 60, i.e. outside of the gate driving circuit 60.

Further, in the configuration according to the present embodiment, one low-potential power supply line 70 is provided. However, this is not intended to limit the present invention. Alternatively, the number of the low-potential power supply line 70 can be two or more.

Figure 5:
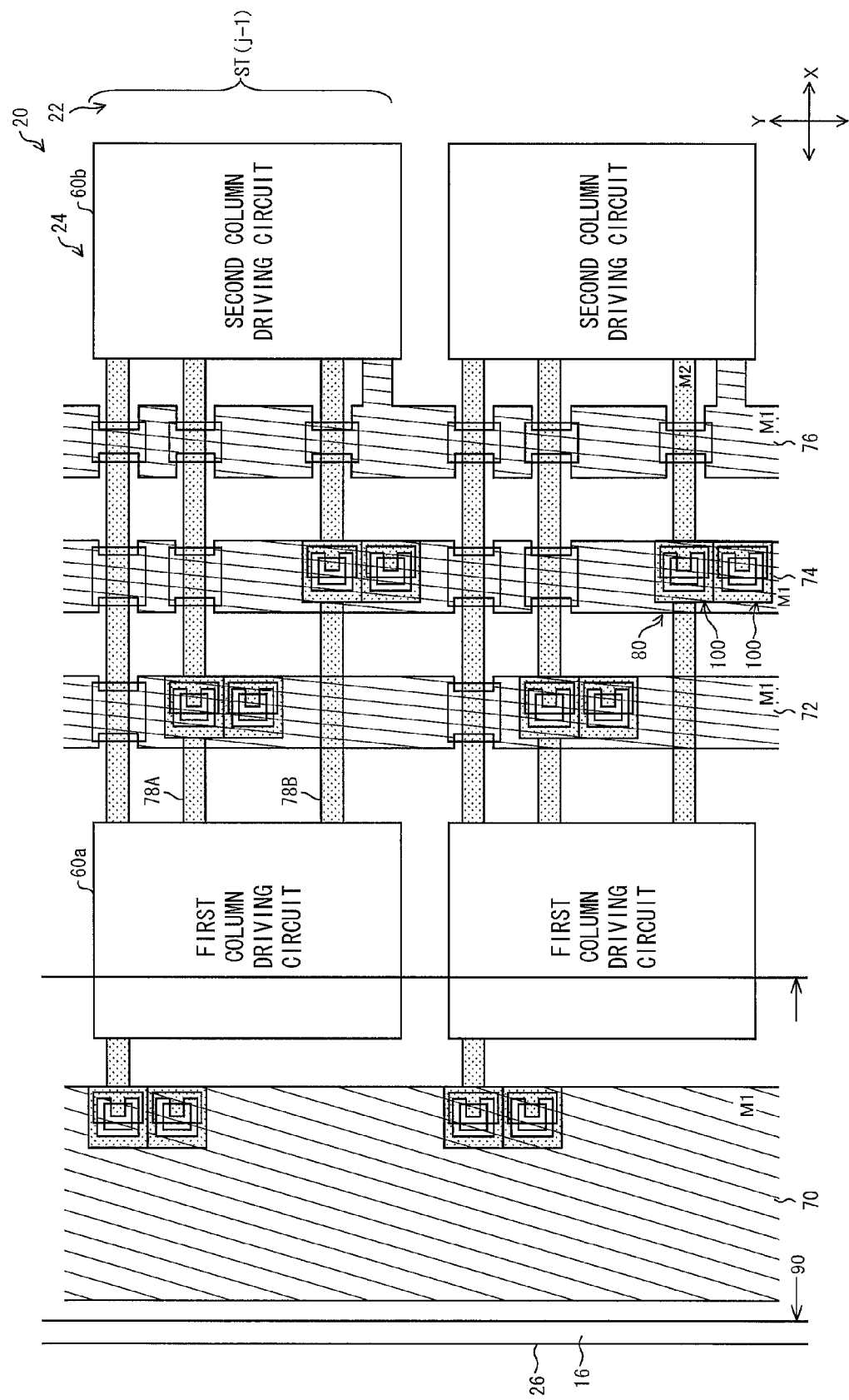
FIG. 5 is a plan view schematically showing the configuration of an essential part of a TFT array substrate for comparison.

With reference to FIG. 5, the following will describe the configuration of an essential part of another TFT array substrate 20 for comparison with the TFT array substrate 20 of the present embodiment.

FIG. 5 is a view schematically showing the configuration of the another TFT array substrate 20 for comparison.

Between the TFT array substrate 20 shown in FIG. 5 and the TFT array substrate 20 shown in FIG. 1 according to the present embodiment, difference is in whether or not the junction lines 79 are provided. That is, the TFT array substrate 20 of the present embodiment is provided with the junction lines 79, whereas the TFT array substrate 20 shown in FIG. 5 is not provided with the junction lines 79. This will be described below.

As shown in FIG. 5, for example, in the stage ST (j−1), a TFT element T1 (not shown) is connected to a branch line 78A so that the TFT element T1 receives a first clock signal from a first clock line 72. A TFT element T2 (not shown) is connected to a branch line 78B so that the TFT element T2 receives a second clock signal from a second clock line 74.

That is, in the stages ST, two branch lines 78 are provided for receipt of the clock signals from the first clock line 72 and the second clock line 74.

Such a configuration increases the number of intersections of the clock lines 72 and 74 (and other trunk line, e.g. an initialization line 76) with the branch lines 78, thus increasing parasitic capacitance. This is more likely to cause signal delay.

On the contrary, in the configuration of the present embodiment, for example, in the stage ST (j), the TFT elements T1 and T3 are connected to the branch line 78B which is electrically connected to the second clock line 74 through the contact hole 100, so that the TFT elements T1 and T3 receive the second clock signal from the second clock line 74. Meanwhile, the TFT elements T2 and T4 are connected to the junction lines 79A and 79B extending from the branch line 78A, respectively, so that the TFT elements T2 and T4 receive the first clock signal from the first clock line 72.

That is, in the stages ST, thanks to provision of the junction lines 79, it is possible to receive the clock signals from the first clock line 72 and the second clock line 74 with provision of only one branch line 78.

In addition, the above-described configuration reduces the number of branch lines, thus preventing yield reduction.

Further, with the above-described configuration, it is possible to prevent the occurrence of signal delay. This is because the above-described configuration reduces the number of intersections of the trunk lines, the clock lines 72 and 74 and the initialization line 76, with the branch lines 78 and results in lowered capacitance in the intersections. This will be described below.

The junction lines 79 can be formed narrower than the branch lines 78 and the clock lines 72 and 74 for the following reason. That is, the junction lines 79 are shorter than the branch lines 78 and the clock lines 72 and 74, and the total capacitance caused by connections to the junction lines 79 is small, and this reduces the need for preventing the occurrence of signal delay by lowering resistance of the lines.

Therefore, even when new intersections are formed between the junction lines 79 and the branch lines 78, it is possible to decrease the capacitance caused. This facilitates the prevention of signal delay in the above-described lines, thus facilitating improvement of a circuit output property.

More specifically, the clock lines 72 and 74 as the trunk lines are generally formed wider than the branch line 78 in order to prevent the occurrence of signal delay caused by high resistance of the lines. This is likely to increase an overlapping area of the intersections of the clock lines 72 and 74 with the branch lines 78.

On the contrary, the TFT array substrate 20 of the present embodiment decreases the number of branch lines 78, thus decreasing the overlapping area of the intersections of the clock lines 72 and 74 with the branch lines 78 correspondingly.

On the other hand, the TFT array substrate 20 of the present embodiment can cause additional intersections of the junction lines 79 with the branch lines 78. However, line widths of the junction lines 79 can be narrower than those of the clock lines 72 and 74.

Therefore, a total area of the additional intersections of the junction lines 79 with the branch lines 78 is smaller than a total area of decreased overlapping area of the intersections of the clock lines 72 and 74 with the branch lines 78.

Therefore, according to the TFT array substrate 20 of the present embodiment enables decrease of the area of the intersections of the different lines, thus facilitating improvement of a circuit output property.

Further, the TFT array substrate 20 of the present embodiment enables preventing the occurrence of signal delay, thus enabling downsizing the TFT elements which are the constituent components of the stages ST. This facilitates downsizing the gate driving circuit, thus enabling provision of a TFT array substrate with a narrow picture frame.

Still further, the TFT array substrate 20 of the present embodiment enables reducing the number of branch lines 78, thus widening a spacing between the branch lines 78. Therefore, it is possible to reduce the occurrence of leakages between the lines and to thus improve yield.

(Position of Seal)

The following will describe the seal 90.

The TFT array substrate 20 and the counter substrate (not shown) are bonded together through the seal 90, which makes up the liquid crystal display panel 10.

As shown in FIG. 1, the TFT array substrate 20 of the present embodiment is such that the low-potential power supply line 70 and part of the first column driving circuit 60$a$ are covered with the seal 90, whereas the first clock line 72, the second clock line 74, the initialization line 76, and the second column driving circuit 60$b$ are not covered with the seal 90.

Accordingly, the contact holes 100 provided on the first clock line 72 and the second clock line 74 are not covered with the seal 90.

Unevenness of cell thickness is likely to occur in the vicinity of a place where the seal 90 is provided due to the steps produced by the contact holes 100 and unevenness of width, density, and other properties of the lines provided below the seal 90. However, with the above-described configuration, the TFT array substrate 20 of the present embodiment enables the prevention of unevenness of cell thickness. This is because the configuration according to the present embodiment realizes reducing the number of the contact holes 100 covered with the seal 90.

Note that the effect of preventing the unevenness of cell thickness is achieved with an arrangement such that one or more gate driving circuit lines 46 extending in the Y direction are provided between the first column driving circuit 60$a$ and the second column driving circuit 60$b$ aligned in the X direction.

(Metallic Material and Other Materials)

The following will describe metallic material and other materials used to form the lines.

The gate driving circuit lines 46, which are the lines extending in the Y direction, and the branch lines 78, which are the lines extending in the X direction, are provided in separate layers on the insulating substrate 16 and formed from different metallic materials. Further, the branch lines 78, which are the lines extending in the X direction, and the junction lines 79 are provided in separate layers on the insulating substrate 16 and formed from different metallic materials.

Figure 2:
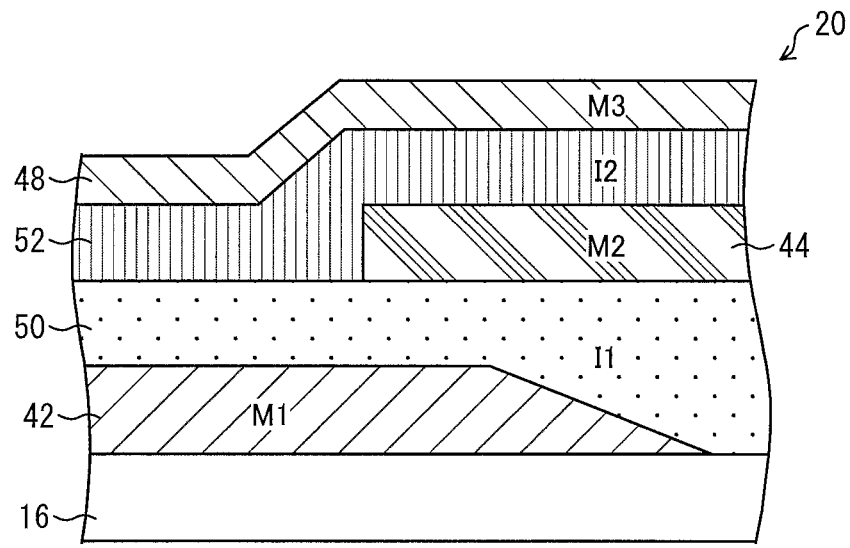
FIG. 2 is a cross-sectional view schematically showing the configuration of the essential part of a TFT array substrate according to First Embodiment of the present invention.

FIG. 2 is a cross-sectional view schematically showing the configuration of the TFT array substrate 20.

As shown in FIG. 2, generally stacked on the insulating substrate 16 are: a first metallic material M1 that forms the gate line 42, a first insulating material I1 that forms a gate insulating film 50, a second metallic material M2 that forms a source line 44, a second insulating material I2 that forms an interlayer insulating film 52, and an electrically conductive material M3 that forms the pixel element 48 in this order.

For example, the first metallic material M1 can be formed by using a single-layer film made from an aluminum alloy film (Al), the second metallic material M2 can be formed by using a laminate film of a titanium (Ti) film and an aluminum (Al) film, the electrically conductive material M3 can be formed by using an ITO (Indium Tin Oxide) film. However, this is not intended to limit the scope of the present invention.

In the present embodiment, the branch lines 78 are formed from the first metallic material M1. The gate driving circuit lines 46, i.e. the low-potential power supply line 70, the first clock line 72, the second clock line 74, and the initialization line 76, and the junction line 79 are formed from the second metallic material M2. However, this is not intended to limit the scope of the present invention. Alternatively, for example, the low-potential power supply line 70 and the initialization line 76 may be formed from the first metallic material M1 that is used to form the gate line 42.

However, if the first metallic material M1 is formed by using the single-layer film made from the aluminum alloy film (Al), for example, it is preferable that the wide trunk lines used as in the present embodiment are formed from the second metallic material M2 and that the narrow branch lines 78 are made from the first metallic material M1, for the following reason.

If the single-layer film made from the aluminum alloy film (Al) is used for the first metallic material M1, the line formed from the first metallic material M1 is likely to be of a serrated pattern edge, and another lines crossing over the line of such pattern edge are likely to break. Therefore, if the wide trunk lines are formed by using the second metallic material M2, they are less likely to break.

At the crossover parts of the lines, a resist film is likely to become uneven, and a line width shift caused by the lines that are made from a lower metallic layer (a layer where the first metallic material M1 is formed) is likely to occur during a photolithographic process. In this regard, it is preferable that the trunk lines wide in line width are formed from the second metallic material M2 and that the branch lines 78 narrow in line width are formed from the first metallic material M1.

(Connection Section)

Figure 3:
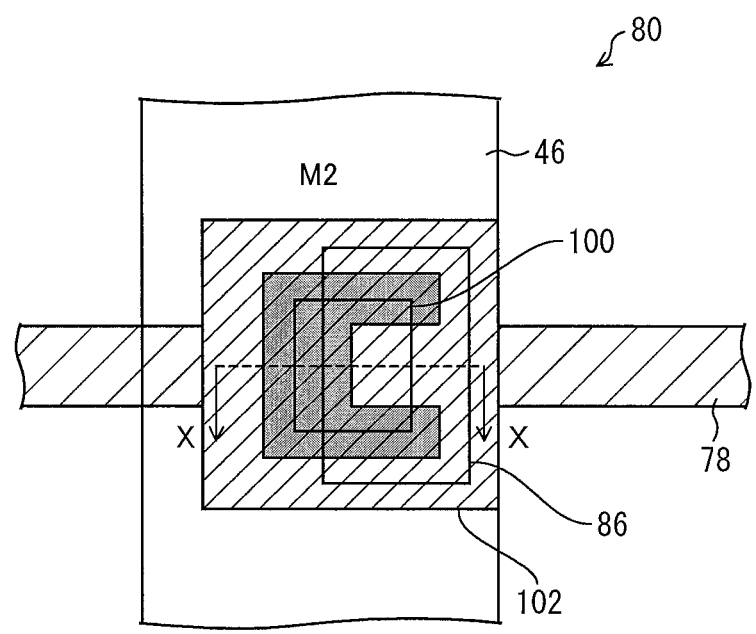
FIG. 3 is a plan view schematically showing the configuration of a switch section according to First Embodiment of the present invention.
Figure 4:
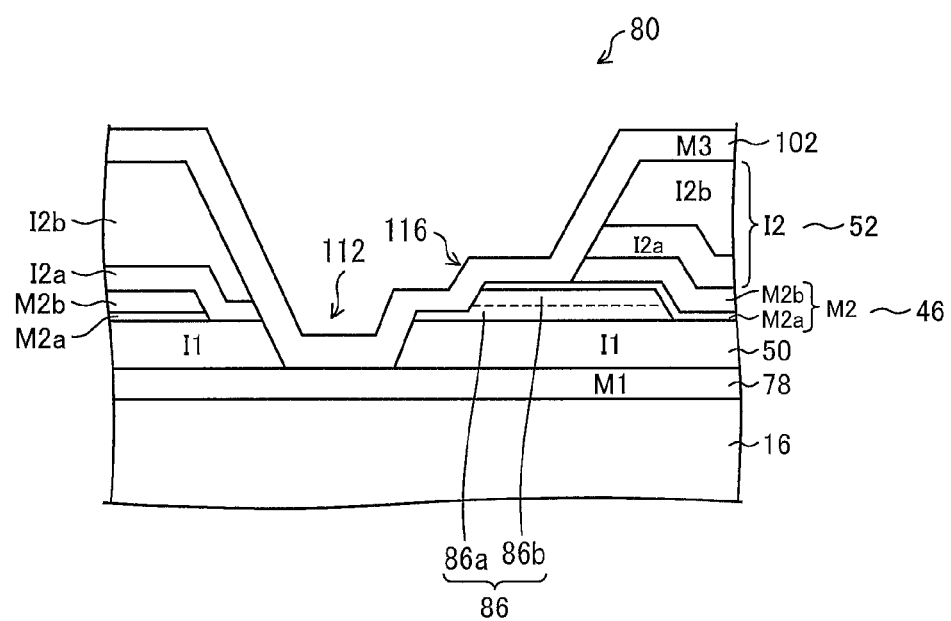
FIG. 4 is a cross-sectional view schematically showing the configuration of the switch section according to First Embodiment of the present invention.

The following will describe details of a connection section 80 with reference to FIGS. 3 and 4.

FIG. 3 is a plan view schematically showing the configuration of the connection section 80.

As shown in FIG. 3, at the connection section 80 between the branch line 78 and the gate driving circuit line 46, the contact hole 100 is provided. The branch line 78 and the gate driving circuit line 46 are electrically connected to each other through a connection conductor 102.

Note that a semiconductor layer 86 is provided between the gate driving circuit line 46 and the branch line 78.

FIG. 4 is a cross-sectional view schematically showing the configuration of the connection section 80 taken along an X-X line in FIG. 3.

As shown in FIG. 4, stacked on the insulating substrate 16 made from a glass substrate or the like are: first metallic material M1, the first insulating material I1, the second metallic material M2, the second insulating material I2, and the electrically conductive material M3 in this order.

At the connection section 80 of the present embodiment, the branch line 78 is formed from the first metallic material M1, the gate driving circuit lines 46 as the trunk lines are formed from the second metallic material M2, and the connection conductor 102 is formed from the electrically conductive material M3.

At a branch line via hole 112, the connection conductor 102 and the branch line 78 are connected to each other.

In the vicinity of the branch line via hole 112 where the connection conductor 102 and the branch line 78 are connected to each other, the gate driving circuit line 46 is provided.

The connection conductor 102 is electrically connected to the gate driving circuit line 46 in a surrounding region 116 of the branch line via hole 112.

In this configuration, at the contact hole 100 of the present embodiment, the branch line 78 and the gate driving circuit line 46 are connected to each other with one via hole, i.e. a single branch line via hole 112 alone.

Further, the TFT array substrate 20 of the present embodiment is provided with the semiconductor layer 86. The semiconductor layer 86 is provided between the gate insulating film 50 and the gate driving circuit line 46. Specifically, the semiconductor layer 86 is made up of (i) a lower semiconductor layer 86a provided on the gate insulating film 50 and (ii) an upper semiconductor layer 86b provided on the lower semiconductor layer 86a.

The lower semiconductor layer 86a is formed from a normal semiconductor layer. The upper semiconductor layer 86b is formed from an ohmic contact layer.

In the TFT array substrate 20 of the present embodiment, the semiconductor layer 86 functions as an etching protective film that protects the first insulating material I1 at the etching of the second insulating material I2. As a result, the first insulating material I1 and the semiconductor layer 86 remain in a stair-like pattern. This prevents disconnecting the connection conductor 102.

In the TFT array substrate 20 of the present embodiment, the gate driving circuit line 46 made from the second metallic material M2 is formed from a double-layer metallic material. Specifically, the gate driving circuit lines 46 is made up of a lower metallic material M2a and an upper metallic material M2b, which lie in this order from a side thereof closer to the insulating substrate 16. The lower metallic material M2a can be formed by using titanium (Ti) (M2a), whereas the upper metallic material M2b can be formed by using aluminum (Al) (M2b).

In the TFT array substrate 20 of the present embodiment, the connection conductor 102 is formed from the electrically conductive material M3. The electrically conductive material M3 can be formed by using ITO (Indium Tin Oxide) or IZO (Indium Zinc Oxide).

(Switch Section)

The switch section 120 between the junction line 79 extending in the Y direction and the branch line 78 is configured in much the same manner as the aforementioned connection section 80, and an explanation thereof is omitted. However, it is noteworthy that a line width of the gate driving circuit line 46 as a trunk line is wider than that of the junction line 79.

Note that it is preferable that the switch sections 120 are not arranged in the region where the seal 90 is formed, for the following reasons.

As described previously, unevenness of cell thickness is likely to occur in the vicinity of a place where the seal 90 is provided due to the steps produced by the contact holes 100 and unevenness of width, density, and other properties of the lines provided below the seal 90. However, the above-described configuration reduces the number of contact holes 100 covered with the seal 90 and thus prevents unevenness of cell thickness.

Further, under the circumstances where the connection conductor 102 is formed from the electrically conductive material M3, such as ITO or IZO, that is used to form the pixel electrode 48 as in the present embodiment, if the switch section 120 is arranged in the region where the seal 90 is formed, a spacer (e.g. fibrous glass) mixed into a sealing material causes damage to the electrically conductive material M3, such as ITO or IZO, that is used to form the pixel electrode 48. This is likely to cause defects such as broken lines and high resistance of the lines.

Second Embodiment

Figure 6:
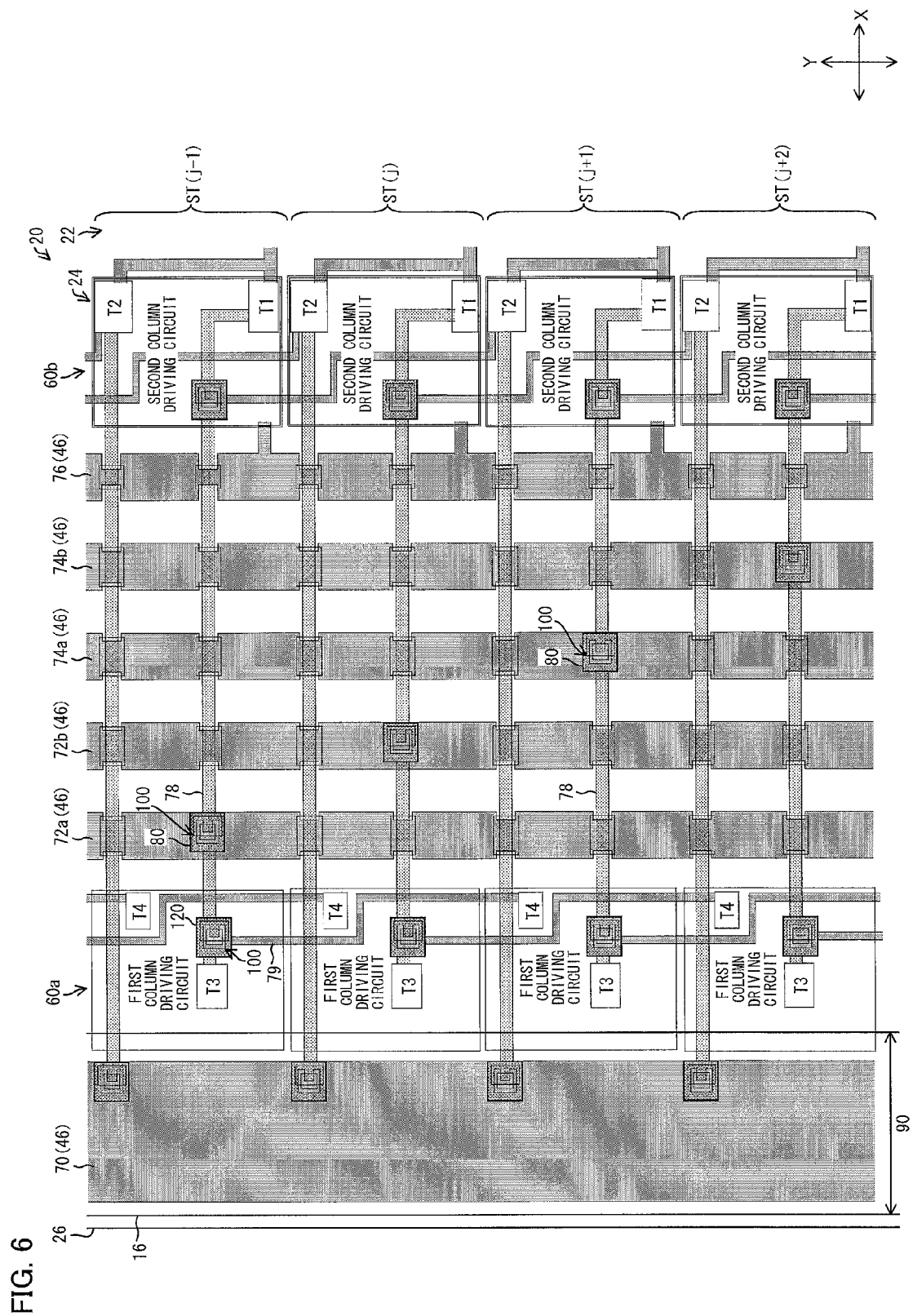
FIG. 6 is a plan view schematically showing the configuration of an essential part of a TFT array substrate according to Second Embodiment of the present invention.

The following will describe a TFT array substrate 20 according to another embodiment of the present invention with reference to FIG. 6.

Note that, for convenience of explanation, members having the same functions as those described in the First Embodiment are given the same reference numerals, and explanations thereof are omitted here.

The TFT array substrate 20 of the present embodiment is different from the TFT array substrate 20 of the First Embodiment in configuration of gate driving circuit lines 46. That is, in the TFT array substrate 20 of the present embodiment, another two clock lines are additionally provided. Accordingly, a manner of extension of junction lines 79 is different from that in the TFT array substrate 20 of the First Embodiment. This will be described below.

As shown in FIG. 6, the TFT array substrate 20 has, in its surrounding area 24, a gate driving circuit 60 and gate driving circuit lines 46 which are connected to FPC (not shown).

The gate driving circuit lines 46 provided along the Y direction of the TFT array substrate 20 are: a low-potential power supply line 70, a clock line 72a, a clock line 72b, a clock line 74a, a clock line 74b, and an initialization line 76, all of which are trunk lines. Specifically, along a direction from a substrate end side 26 toward a display area 22, one low-potential power supply line 70, the clock line 72a, the clock line 72b, the clock line 74a, the clock line 74b, and the initialization line 76 are provided in this order.

The gate driving circuit 60 has a plurality of stages ST connected to each other in a cascaded manner in the Y direction. The stages ST sequentially output gate signals to the gate lines 42. Note that the stages ST are connected to the gate lines 42 on a one-to-one basis.

Each of the stages ST includes a first column driving circuit 60a and a second column driving circuit 60b both of which are aligned in the X direction.

Each of the first column driving circuits 60a is provided between the low-potential power supply line 70 and the clock line 72a, both of which are trunk lines. Each of the second column driving circuits 60b lies in a boundary region between the display area 22 and the surrounding area 24 and is provided between the display area 22 and the initialization line 76.

Note that each of the first column driving circuits 60a includes TFT elements T3 and T4, and each of the second column driving circuits 60b includes TFT elements T1 and T2.

Further, branch lines 78 are provided to connect the gate driving circuit lines 46 to the TFT elements provided in the gate driving circuit 60. Contact holes 100 are provided at corresponding connection sections 80 between the branch lines 78 and the gate driving circuit lines 46. Through the contact holes 100, the gate driving circuit lines 46 and the gate driving circuit 60 are electrically connected to each other.

For example, in a stage ST (j+1), the TFT elements T1 and T3 are connected to the branch line 78 which is electrically connected to the clock line 74a through the contact hole 100, so that the TFT elements T1 and T3 receive the clock signal from the clock line 74a.

Meanwhile, in a stage ST (j+1), the TFT elements T2 and T4 are connected to the respective junction lines 79 provided in a stage ST (j−1) and extending from the branch line 78 which is electrically connected to the clock line 72a through the contact hole 100, so that the TFT elements T2 and T4 receive the clock signal from the clock line 72a.

Note that the contact hole 100 is provided at a switch section 120 between the branch line 78 and the junction line 79, and the branch line 78 and the junction line 79 are electrically connected to each other.

Here, from the clock line 72a and the clock line 74a, clock signals of mutually reversed phases are outputted. From the clock line 72b and the clock line 74b, clock signals of mutually reversed phases are outputted.

Further, the signals outputted from the clock line 72a and the clock line 72b are not identical to each other, and the signals outputted from the clock line 74a and the clock line 74b are also not identical to each other.

As described above, the manner of extension of the junction lines 79 in the present embodiment is different from that in the First Embodiment.

For example, in the First Embodiment, the TFT elements T2 and T4 arranged in the stage ST (j) are connected to the junction line 79 which is electrically connected to the branch line 78 arranged in the stage ST (j−1), so that the TFT elements T2 and T4 receive the clock signal from the clock line 72. Meanwhile, the TFT elements T1 and T3 are electrically connected to the branch line 78, so that the TFT elements T1 and T3 receive the clock signal from the clock line 74. On the contrary, in the present embodiment, the TFT elements T2 and T4 arranged in the stage ST (j+1) are connected to the junction line 79 which is electrically connected to the branch line 78 arranged in the stage ST (j−1), so that the TFT elements T2 and T4 receive the clock signal from the clock line 72a. Meanwhile, the TFT elements T1 and T3 are electrically connected to the branch line 78, so that the TFT elements T1 and T3 receive the clock signal from the clock line 74a.

This is because it is required that the clock signals of mutually reversed phases are inputted respectively to the TFT elements T1 and T2 arranged in each of the stages ST, and it is also required that the clock signals of mutually reversed phases are inputted respectively to the TFT elements T3 and T4.

In such a manner of driving, it is possible to increase the number of pixel electrodes arranged in the Y direction, without reducing the length of an ON time of the TFT elements (switching elements) for display driving. That is, it is possible to provide a high-aperture-ratio, high-definition display device with no flickers and other defects responsible for decrease in display quality, without the need for upsizing of the switching elements for display driving.

Further, even when a cost-cutting technique is applied such that a long side of a pixel electrode corresponding to each primary color for color display is arranged along a direction to which the gate lines 42 extend for the purpose of reducing the number of source driving circuits, the reduction of the length of ON time of the switching elements for display driving is not required. Therefore, it is possible to provide a high-aperture-ratio display device with excellent display quality.

In the present embodiment, the clock lines 72 and the clock lines 74 are respectively provided in pairs. Alternatively, the present embodiment is also feasible with the clock lines 72 and clock lines 74 in groups of three or more, respectively.

In the present embodiment, by addition of two clock lines, the number of stages ST to which one clock line supplies signals is reduced to half of that in the First Embodiment.

That is, the number of TFT elements connected to one clock line is reduced to half. Thus, it is possible to reduce a load correspondingly.

(Modified Example)

Figure 7:
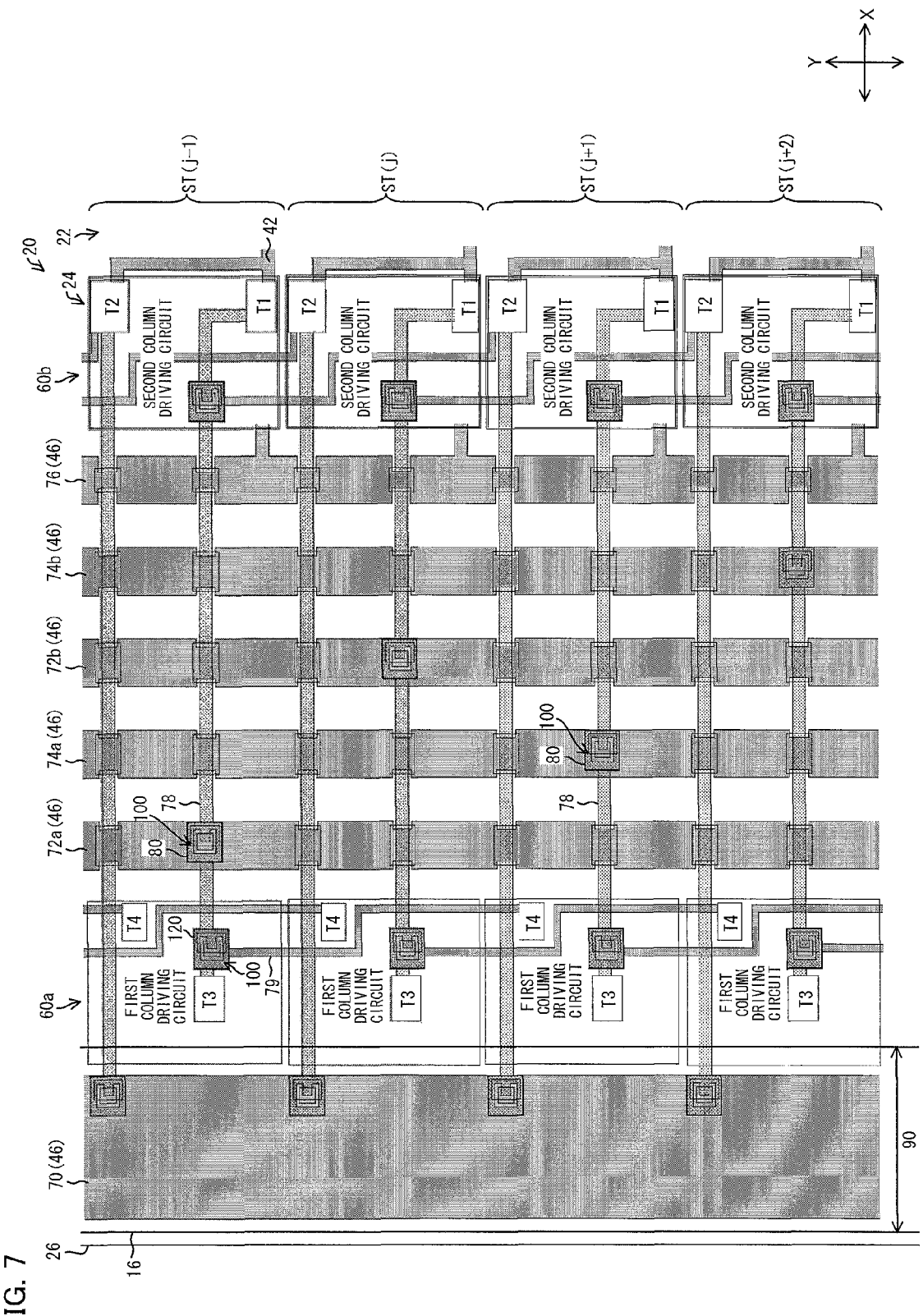
FIG. 7 is a plan view schematically showing the configuration of an essential part of a TFT array substrate according to a modified example of the Second Embodiment of the present invention.

The following will describe a TFT array substrate 20 of a modified example of the present embodiment with reference to FIG. 7.

FIG. 7 is a view schematically showing the TFT array substrate 20 of the modified example of the present embodiment.

The TFT array substrate 20 of the present modified example is different from the TFT array substrate 20 of the Second Embodiment in pattern of locations of clock lines.

Specifically, two clock lines of mutually reversed phases are adjacent to each other.

A detailed explanation is as follows. As shown in FIG. 7, the gate driving circuit lines 46 provided along the Y direction of the TFT array substrate 20 are: the low-potential power supply line 70, the clock line 72a, the clock line 74a, the clock line 72b, the clock line 74b, and the initialization line 76, all of which are trunk lines. More specifically, along a direction from the substrate end side 26 toward the display area 22, one low-potential power supply line 70, the clock line 72a, the clock line 74a, the clock line 72b, the clock line 74b, and the initialization line 76 are provided in this order.

For example, in the stage ST (j+1), the TFT elements T1 and T3 are connected to the branch line 78 which is electrically connected to the clock line 74a through the contact hole 100, so that the TFT elements T1 and T3 receive a clock signal from the clock line 74a.

Meanwhile, in the stage ST (j+1), the TFT elements T2 and T4 are connected to the respective junction lines 79 provided in the stage ST (j−1) and extending from the branch line 78 which is electrically connected to the clock line 72a through the contact hole 100, so that the TFT elements T2 and T4 receive the clock signal from the clock line 72a.

Here, the contact hole 100 is provided at the switch section 120 between the branch line 78 and the junction line 79, and the branch line 78 and the junction line 79 are electrically connected to each other.

Also in the present modified example, the number of stages ST to which one clock line supplies signals is reduced to half of that in the First Embodiment.

That is, the number of TFT elements connected to one clock line is reduced to half. Thus, it is possible to reduce a load correspondingly.

Third Embodiment

Figure 8:
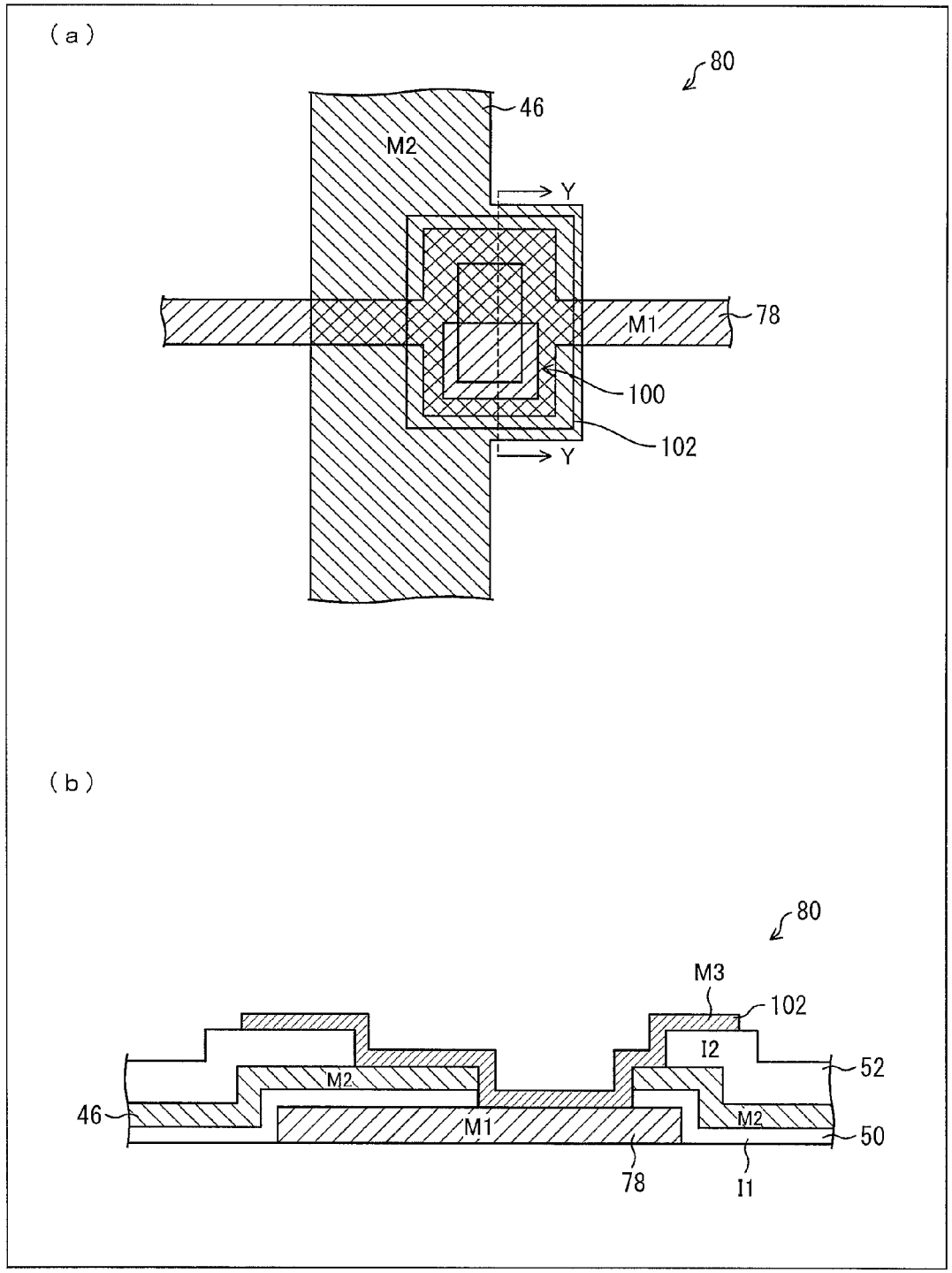
FIG. 8 (a) of FIG. 8 is a plan view schematically showing an example of the configuration of a switch section (connection section) according to Third Embodiment of the present invention, (b) of FIG. 8 is a cross-sectional view of the switch section.
Figure 9:
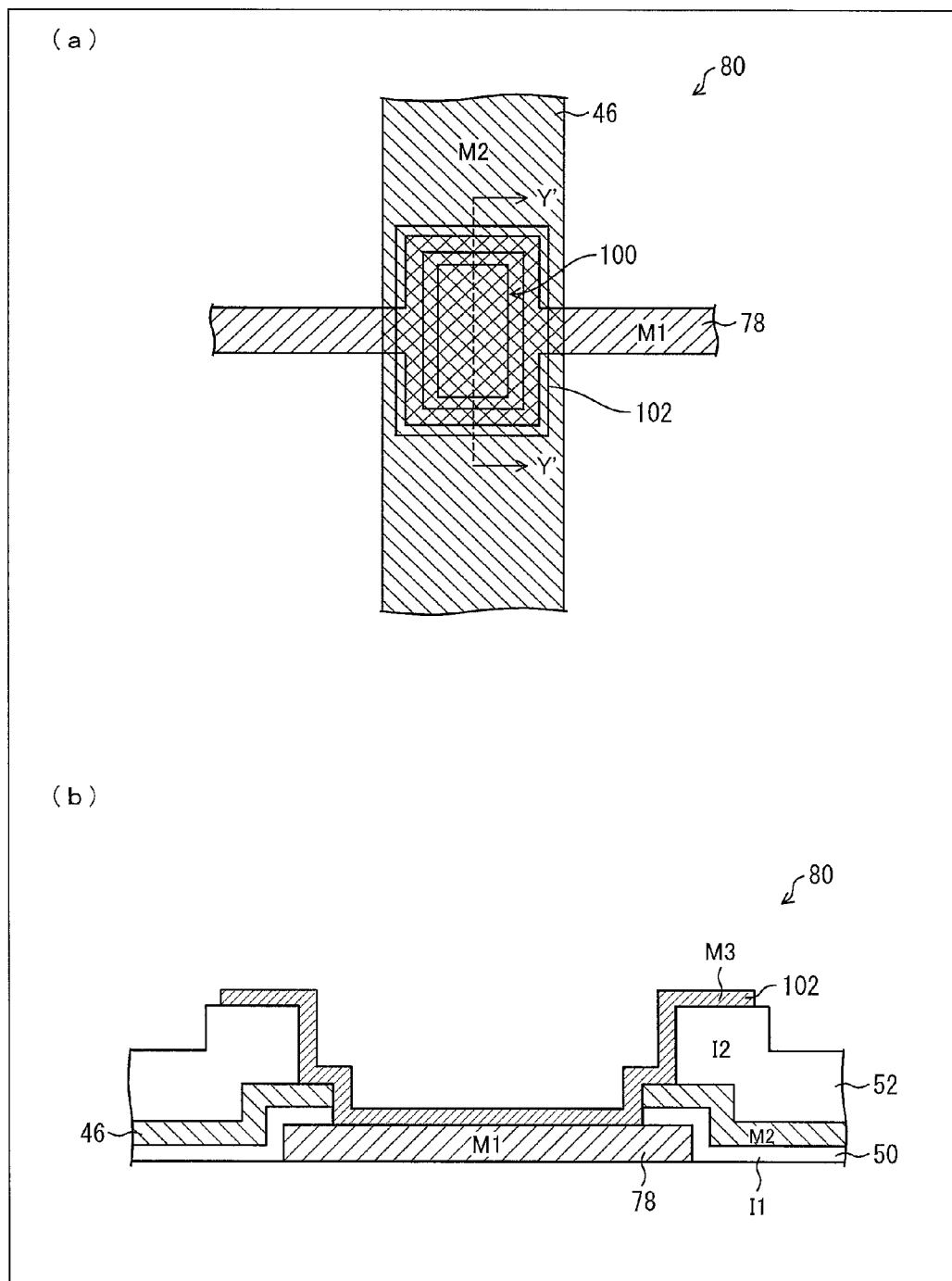
FIG. 9 (a) of FIG. 9 is a plan view schematically showing an example of the configuration of a switch section (connection section) according to Third Embodiment of the present invention, (b) of FIG. 9 is a cross-sectional view of the switch section.
Figure 10:
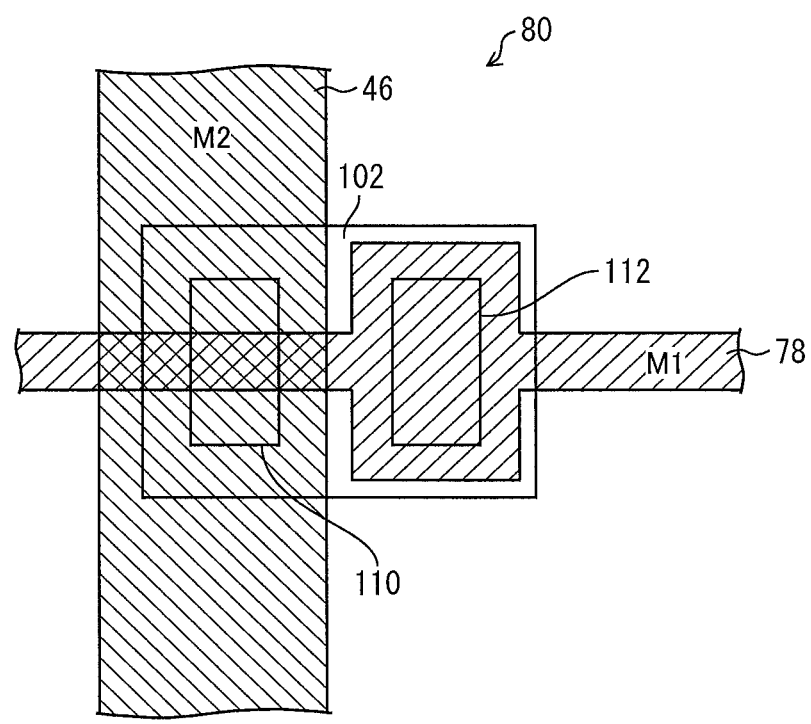
FIG. 10 is a plan view schematically showing an example of the configuration of a switch section (connection section) according to Third Embodiment of the present invention.

The following will describe a TFT array substrate 20 according to still another embodiment of the present invention with reference to FIGS. 8 through 10.

Note that, for convenience of explanation, members having the same functions as those described in the First and Second Embodiment are given the same reference numerals, and explanations thereof are omitted here.

The TFT array substrate 20 of the present embodiment is different from the TFT array substrate 20 of the First Embodiment in configuration of the connection section 80 (switch section 120).

In FIG. 8, (a) is a plan view schematically showing an example of the configuration of the connection section 80 according to the present embodiment, and (b) is a cross-sectional view of the connection section 80 taken along a Y-Y line in (a) of FIG. 8.

As shown in FIG. 8, the connection section 80 connects the branch line 78 to the each of the gate driving circuit lines 46.

The branch line 78 is formed from a first metallic material M1 from which a gate line 42 layer is made. The gate driving circuit line 46 is formed from a second metallic material M2 from which a source line 44 layer is made. Therefore, the branch line 78 and each of the gate driving circuit lines 46 are provided in different layers on the insulating substrate 16.

Note that the connection conductor 102 provided at the connection section 80 connects the branch line 78 and each of the gate driving circuit lines 46. Here, the connection conductor 102 is formed from an electrically conductive material M3, which is a material used to form a pixel electrode.

As shown in (a) of FIG. 8, part of the connection section 80 lies off the trunk line, when viewed from the top thereof.

That is, the connection section 80 shown in FIG. 3 is configured not to lie off the gate driving circuit line 46. On the contrary, as to the connection section 80 shown in (a) of FIG. 8, part of the connection section 80 is configured to lie off the gate driving circuit lines 46 as a trunk line.

With the configuration of the connection section 80 as shown in FIG. 8, the effect of improving display quality and yield is achieved.

More specifically, in order to adopt the connection structure shown in FIG. 3 in the configuration where the gate driving circuit line 46 is formed from a second metallic material M2 from which a source line 44 layer is made, the gate driving circuit line 46 needs to be partially opened at the connection section 80. This opening may cause increase in resistance of the gate driving circuit line 46 and yield reduction caused by broken lines. On the contrary, in the configuration of the connection section 80 shown in FIG. 8, the gate driving circuit line 46 is wide in line width at its part where the opening is provided. This makes it possible to improve display quality and yield.

In FIG. 9, (a) is a plan view schematically showing another example of the configuration of the connection section 80 according to the present embodiment, and (b) is a cross-sectional view of the connection section 80 taken along a Y'-Y' line in (a) of FIG. 9.

As shown in FIG. 9, the connection section 80 connects the branch line 78 to the gate driving circuit line 46.

The branch line 78 is formed from the first metallic material M1 from which the gate line 42 layer is made. The gate driving circuit line 46 is formed from the second metallic material M2 from which the source line 44 layer is made. Therefore, the branch line 78 and the gate driving circuit line 46 are provided in different layers on the insulating substrate 16.

Note that the connection conductor 102 provided at the connection section 80 connects the branch line 78 and the gate driving circuit line 46. Here, the connection conductor 102 is formed from an electrically conductive material M3, which is a material used to form a pixel electrode.

As shown in (a) of FIG. 9, the connection section 80 overlaps the gate driving circuit line 46, when viewed from the top thereof. In addition, side edges of the connection conductor 102 are kept aligned to side edges of the gate driving circuit line 46. Therefore, the connection conductor 102 does not have a part lying off the gate driving circuit line 46, when viewed from the top thereof.

Here, for example, assume that a single layer Mo or the like is used for the second metallic material M2, and a manufacturing process by which the connection conductor 102 is less likely to break at an edge part of the opening of the gate driving circuit lines 46 is selected. In this case, a simple configuration as shown in FIG. 9 (as compared to the configuration shown in FIG. 3) can be used.

FIG. 10 is a plan view schematically showing still another example of the configuration of the connection section 80 according to the present embodiment.

As shown in FIG. 10, the connection section 80 connects the branch line 78 to the gate driving circuit line 46.

The branch line 78 is formed from the first metallic material M1 from which the gate line 42 layer is made. The gate driving circuit line 46 is formed from the second metallic material M2 from which the source line 44 layer is made. Therefore, the branch line 78 and the gate driving circuit line 46 are provided in different layers on the insulating substrate 16.

Note that the connection conductor 102 provided at the connection section 80 connects the branch line 78 and the gate driving circuit line 46. Here, the connection conductor 102 is formed from an electrically conductive material M3, which is a material used to form a pixel electrode.

As shown in FIG. 10, the connection section 80 lies off the gate driving circuit line 46, when viewed from the top thereof.

Specifically, in a region where the connection conductor 102 and the gate driving circuit line 46 overlap each other when viewed from the top thereof, the connection conductor 102 and the gate driving circuit line 46 are electrically connected to each other through a trunk line via hole 110.

Further, in a region where the connection conductor 102 and the branch line 78 overlap each other when viewed from the top thereof, the connection conductor 102 and the branch line 78 are electrically connected to each other through a branch line via hole 112.

That is, in the connection section 80, the branch line 78 and the gate driving circuit line 46 are connected to each other through two via holes.

With the configuration of the connection section 80 shown in FIG. 10, the effect of improving display quality and yield is achieved.

More specifically, in order to adopt the connection structure shown in FIG. 3 in the configuration where the gate driving circuit line 46 is formed from the second metallic material M2 in the source line 44 layer, the gate driving circuit line 46 needs to be partially opened at the connection section 80. This opening may cause increase in resistance of the gate driving circuit line 46 and yield reduction caused by broken lines. However, with the configuration of the connection section 80 shown in FIG. 10, it is possible to improve display quality and yield.

The switch section 120 between the junction line 79 and the branch line 78 is configured in much the same manner as the aforementioned connection section 80, and an explanation thereof is omitted. However, it is noteworthy that a line width of the gate driving circuit line 46 as a trunk line is wider than that of the junction line 79.

(Modified Example)

Figure 11:
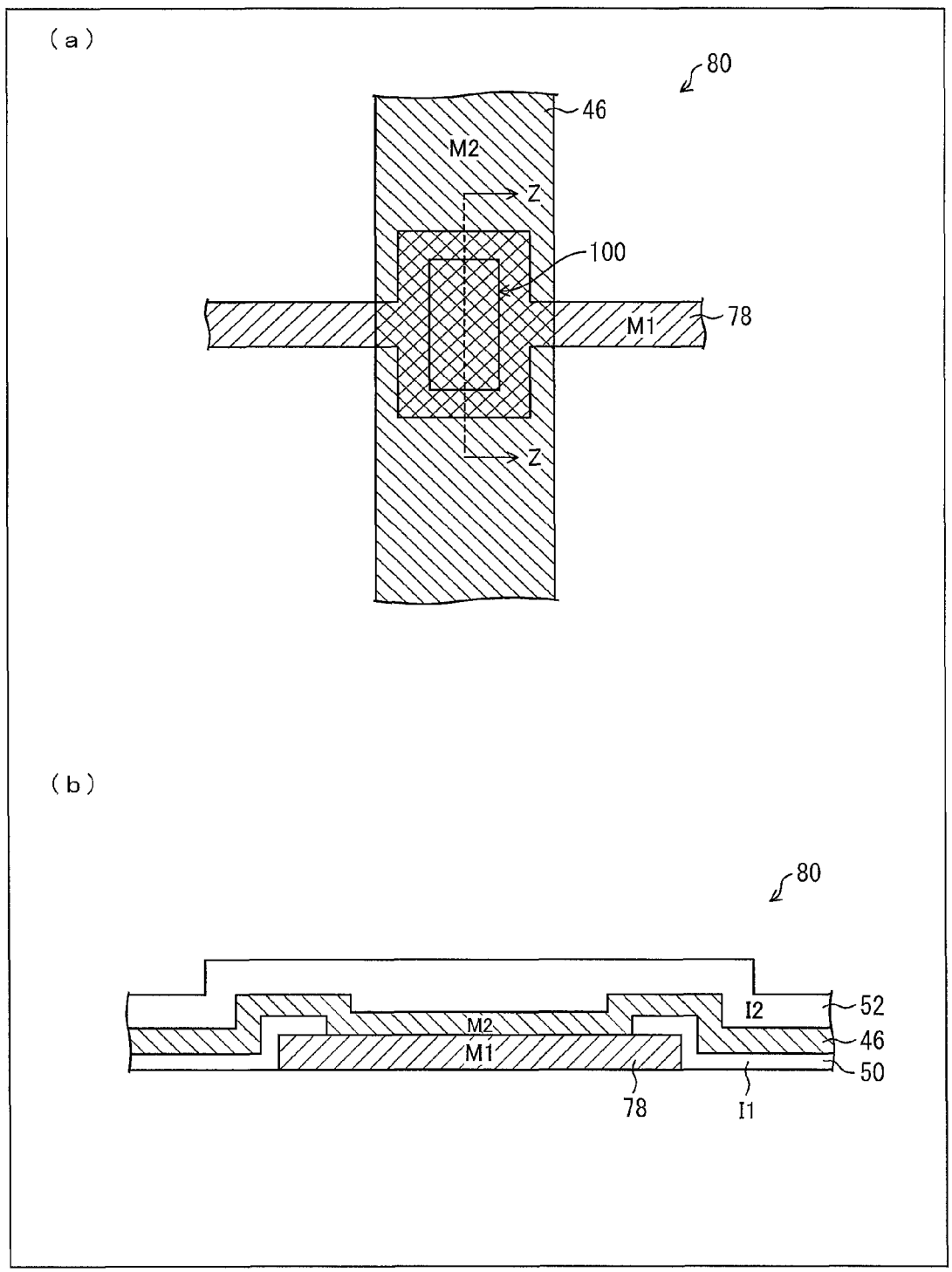
FIG. 11 (a) of FIG. 11 is a plan view schematically showing the configuration of a switch section (connection section) according to a modified example of the Third Embodiment of the present invention.

The following will describe a modified example of the TFT array substrate 20 of the present embodiment with reference to FIG. 11.

In FIG. 11, (a) is a plan view schematically showing the configuration of the connection section 80 of a modified example of the present embodiment, and (b) is a cross-sectional view of the connection section 80 taken along a Z-Z line in (a) of FIG. 11.

As shown in FIG. 11, the first metallic material M1 used to form the branch line 78 and the second metallic material M2 used to form the gate driving circuit line 46 are electrically connected directly to each other through the contact hole 100 which is provided in the first insulating material I1 used to form the gate insulating film 50. That is, unlike the First Embodiment, the connection conductor 102 is not formed from the material for the pixel electrode.

Note that on the gate insulating film 50, for example, an island-shaped semiconductor layer (not shown) is provided.

In addition, it is preferable that a photomask for patterning of a semiconductor layer is a halftone mask capable of controlling the amount of light exposure.

By using the halftone mask, the following process can be carried out. That is, a region of the gate insulating film 50 corresponding to the contact hole 100 is not covered with a resist film. A region of the gate insulating film 50 where the gate insulating film 50 and the semiconductor layer is to be retained is heavily covered with the resist film. A region of the gate insulating film 50 where only the semiconductor layer is to be removed and the gate insulating film 50 is to be retained can be lightly covered with the resist film.

By performing etching by using the resist film as a mask, both patterning of the island-shaped semiconductor layer and patterning of the contact hole 100 of the gate insulating film 50 can be carried out by using one photomask.

Alternatively, the patterning of the semiconductor layer and the patterning of the contact hole 100 of the gate insulating film 50 may be carried out by using separately prepared photomask, i.e. a photomask for patterning of the semiconductor layer and a photomask for patterning of the gate insulating film 50.

In the present modified example, the connection conductor 102 is not formed from the material for the pixel electrode. This makes it possible to reduce the occurrence of defects, such as broken lines and high resistance, caused by damage to the pixel electrode material, such as ITO or IZO, by a spacer (e.g. fibrous glass) mixed into a sealing material.

The switch section 120 between the junction line 79 and the branch line 78 is configured in much the same manner as the aforementioned connection section 80, and an explanation thereof is omitted. However, it is noteworthy that a line width of the gate driving circuit line 46 as a trunk line is wider than that of the junction line 79.

In the aforementioned embodiments, the branch line 78 is formed from the first metallic material M1 from which the gate line 42 layer is made, and the gate driving circuit line 46 is formed from the second metallic material M2 from which the source line 44 layer is made. Alternatively, the branch line 78 may be formed from the second metallic material M2 as the source line 44 layer, and the gate driving circuit line 46 may be formed from the first metallic material M1 as the gate line 42 layer.

The present invention is not limited to the aforementioned embodiments and is susceptible of various changes within the scope of the accompanying claims. Also, an embodiment obtained by suitable combinations of technical means disclosed in the different embodiments are also included within the technical scope of the present invention.

An array substrate of the present invention is characterized in that the driving circuits are provided on both ends of the surrounding area so that the display area is positioned between the driving circuits.

With the above-described configuration, in cases where each of the signal lines electrically connected to the driving circuits and supplying driving signals to the switching elements receives signals from both sides thereof, it is possible to decrease waveform distortions of the signals. Further, the above-described configuration enables downsizing of the plurality of driving elements making up the driving circuits. This makes it possible to provide a display panel having a narrow picture frame.

Even in cases where each of the signal lines receives from its one side, the signal lines are classified into groups on which driving circuits the signal lines are connected to. This makes it possible to make the right and left picture frame areas of the display panel equal.

The array substrate of the present invention is characterized in that the trunk line of the driving circuit provided on one of the ends of the surrounding area is electrically connected to the trunk line of the driving circuit provided on the other end of the surrounding area.

To the trunk line, signals necessary for operation of the driving circuit are supplied from a DC/DC converter and a display control circuit, which are located outside the array substrate, through FPCs (Flexible Printed Circuits) or the like. The above-described configuration eliminates the need for supply of the signals to the both trunk lines through the FPC, for example. That is, it is possible to form the FPC with a narrow width and to thus reduce cost of the FPCs.

The array substrate of the present invention is characterized in that the junction line is provided to electrically connect the driving elements respectively provided in the different row groups to each other in each of the column groups.

With the above-described configuration, by using one branch line, it is possible to electrically connect the trunk line to two driving elements respectively provided in the different row groups in each of the column groups. This makes it possible to reduce the number of branch lines.

The array substrate of the present invention is characterized in that the trunk lines comprise at least a clock line, an initialization line, and a low-potential power supply line.

With the above-described configuration, it is possible to provide a low-potential signal that supplies a potential for turning off the driving element, a clock signal, and an initialization signal to the driving circuits.

The array substrate of the present invention is characterized in that the low-potential power supply line is provided in the surrounding area between the end side of the insulating substrate and the driving circuit.

If the low-potential power supply line is provided between the adjacent column groups or between the driving circuits rather than near the end side of the insulating substrate, part of the driving circuit gets too close to the substrate end side of the liquid crystal display panel and lies off the edge of the seal. This causes the problem that static-electricity-induced breakdown in the element, property abnormalities, corrosion, and other defects are likely to occur.

On the contrary, in the above-described configuration, the low-potential power supply line is provided between the end side of the insulating substrate and the driving circuit. This makes it possible to prevent the occurrence of the above problem.

The array substrate of the present invention is characterized in that the switching elements are transistor elements, scanning signal lines electrically connected to the transistor elements are provided on the insulating substrate, a plurality of the driving elements are provided in each of the row groups and electrically connected to the scanning signal lines, and at least one of the plurality of the driving elements in each of the row groups is electrically connected to the junction line and low-potential power supply line.

With the above-described configuration, it is possible to send the clock signal to the driving element connected to the low-potential power supply line, without direct connection of the branch line to that driving element.

The array substrate of the present invention is characterized in that the low-potential power supply line is a direct-current power supply line that supplies a potential for turning off the driving element.

The above-described configuration allows the low-potential power supply line to supply a stable potential.

The array substrate of the present invention is characterized in that the trunk lines provided between the adjacent column groups comprise at least the clock line and the initialization line.

The above-described configuration enables the reduction of the lengths of the branch lines that connect the clock line and the initialization line as the trunk lines to the driving elements, thus enabling the reduction of the occurrence of breaks in the lines.

The array substrate of the present invention is characterized in that the trunk lines provided between the adjacent column groups comprise at least two clock lines of mutually reversed phases, and the clock lines of mutually reversed phases are connected respectively to the driving elements provided in the row groups corresponding to the different rows of the pixel electrodes.

With the above-described configuration, it is possible to readily provide clock signals of reversed phases to the driving circuits while curbing the occurrence of breaks in the lines.

The array substrate of the present invention is characterized in that the switching elements and the driving elements are TFT elements.

A display panel of the present invention is a liquid crystal display panel including: the above-described array substrate; and a counter substrate being bonded to the array substrate through a seal, wherein the seal is provided in the surrounding area so as not to overlap a connection part between the branch line and the junction line when viewed from top of the liquid crystal display panel.

In cases where the contact holes formed on the substrate are covered with the seal, a thickness of the seal is likely to become uneven.

In this regard, the above-described configuration makes it possible to reduce the number of contact holes covered with the seal, thus preventing uneven seal thickness and in turn preventing uneven cell thickness.

Further, under the circumstances where the connection conductor is formed from a metallic material, such as ITO or IZO (Indium Zinc Oxide), used to form the pixel electrode, when the branch line and the junction line are connected to each other through the connection conductor, it is possible to prevent the occurrence of defects, such as broken lines and high resistance, caused by damage to the metallic material by a spacer (e.g. fibrous glass) mixed into a sealing material.

INDUSTRIAL APPLICABILITY

The present invention provides a TFT array substrate having a narrow picture frame and curbing the occurrence of breaks in lines and is thus suitably applicable to display devices, such as a liquid crystal display device, sensors, and the like.

REFERENCE SIGNS LIST

10 Liquid crystal display panel
16 Insulating substrate
20 TFT array substrate (array substrate)
22 Display area
24 Surrounding area
26 Substrate end side 42 Gate line
44 Source line
46 Gate driving circuit line
48 Pixel electrode
50 Gate insulating film
52 Interlayer insulating film
60 Gate driving circuit
60a First column driving circuit (column group)
60b Second column driving circuit (column group)
70 Low-potential power supply line
72 First clock line
74 Second clock line
76 Initialization line
78 Branch line
79 Junction line
80 Connection section
86 Semiconductor layer
90 Seal
100 Contact hole
102 Connection conductor
120 Switch section

The invention claimed is:

1. An array substrate comprising:
an insulating substrate having a display area and its surrounding area;
switching elements arranged in a matrix manner on the insulating substrate;
pixel electrodes arranged in a matrix manner in the display area of the insulating substrate and being connected to the switching elements; and
driving circuits for driving the switching elements, the driving circuits being provided in the surrounding area and comprising a plurality of column groups arranged in a direction from an end side of the insulating substrate toward the display area, wherein each of the column groups has a longitudinal side along the end side of the insulating substrate and comprises a plurality of row groups corresponding to rows of the pixel electrodes arranged in a matrix manner and each having a plurality of driving elements;
a plurality of trunk lines extending along the end side of the insulating substrate in the surrounding area, at least one of the trunk lines being provided between the adjacent column groups;
branch lines being provided in the surrounding area and each connecting the trunk line to the driving element; and
junction lines each extending from the branch line of interest to electrically connect the branch line of interest to the driving element provided in the row group different from the row group where the driving element connected to the branch line of interest is provided.

2. The array substrate according to claim 1, wherein the driving circuits are provided on both ends of the surrounding area so that the display area is positioned between the driving circuits.

3. The array substrate according to claim 2, wherein the trunk line of the driving circuit provided on one of the ends of the surrounding area is electrically connected to the trunk line of the driving circuit provided on the other end of the surrounding area.

4. The array substrate according to claim 1, wherein the junction line is provided to electrically connect the driving elements respectively provided in the different row groups to each other in each of the column groups.

5. The array substrate according to of claim 1, wherein the trunk lines comprise at least a clock line, an initialization line, and a low-potential power supply line.

6. The array substrate according to claim 5, wherein the low-potential power supply line is provided in the surrounding area between the end side of the insulating substrate and the driving circuit.

7. The array substrate according to claim 5, wherein the switching elements are transistor elements,
scanning signal lines electrically connected to the transistor elements are provided on the insulating substrate,
a plurality of the driving elements are provided in each of the row groups and electrically connected to the scanning signal lines, and
at least one of the plurality of the driving elements in each of the row groups is electrically connected to the junction line and low-potential power supply line.

8. The array substrate according to claim 5, wherein the low-potential power supply line is a direct-current power supply line that supplies a potential for turning off the driving element.

9. The array substrate according to claim 5, wherein the trunk lines provided between the adjacent column groups comprise at least the clock line and the initialization line.

10. The array substrate according to claim 1, wherein the trunk lines provided between the adjacent column groups comprise at least two clock lines of mutually reversed phases, and
the clock lines of mutually reversed phases are connected respectively to the driving elements provided in the row groups corresponding to the different rows of the pixel electrodes.

11. The array substrate according to claim 1, wherein the switching elements and the driving elements are TFT elements.

12. A liquid crystal display panel comprising:
an array substrate according to claim 1; and
a counter substrate being bonded to the array substrate through a seal,
wherein the seal is provided in the surrounding area so as not to overlap a connection part between the branch line and the junction line when viewed from top of the liquid crystal display panel.

* * * * *